United States Patent
Choi et al.

(10) Patent No.: US 7,514,980 B2
(45) Date of Patent: Apr. 7, 2009

(54) EXPONENTIAL FUNCTION GENERATOR AND VARIABLE GAIN AMPLIFIER USING THE SAME

(75) Inventors: Jeong Ki Choi, Kyungki-do (KR); Won Jin Baek, Kyungki-do (KR); Hyun Hwan Yoo, Seoul (KR); Seung Min Oh, Kyungki-do (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 124 days.

(21) Appl. No.: 11/420,728

(22) Filed: May 26, 2006

(65) Prior Publication Data

US 2006/0290417 A1 Dec. 28, 2006

(30) Foreign Application Priority Data

Jun. 23, 2005 (KR) .................. 10-2005-0054496

(51) Int. Cl.
*G06F 7/556* (2006.01)
*G06G 7/20* (2006.01)
*G06G 7/24* (2006.01)

(52) U.S. Cl. .................. 327/346; 327/347; 327/348; 327/349; 327/543

(58) Field of Classification Search .................. 327/543, 327/346–349
See application file for complete search history.

(56) References Cited

U.S. PATENT DOCUMENTS 5,300,837 A * 4/1994 Fischer .................. 327/281

6,259,321 B1   7/2001  Song et al.
6,744,319 B2 * 6/2004  Kim ..................... 330/254
6,897,717 B1   5/2005  Eddleman et al.
2003/0141932 A1 7/2003 Toyota et al.

FOREIGN PATENT DOCUMENTS

| GB | 2398891 A | 1/2004 |
| JP | 57-127311 A | 8/1982 |
| JP | 63-309010 A | 12/1988 |
| JP | 07-058562 A | 3/1995 |

(Continued)

OTHER PUBLICATIONS

Korean Intellectual Property Office, Office Action mailed Sep. 29, 2006.

(Continued)

*Primary Examiner*—Long Nguyen
*Assistant Examiner*—Brandon S Cole
(74) *Attorney, Agent, or Firm*—Lowe Hauptman Ham & Berner (57) ABSTRACT

The present invention relates to an exponential function generator which is realized with only CMOS element without BJT element, not limited by the physical properties of the element or a square circuit, and not complicated in its configuration, and a variable gain amplifier using the same. The exponential function generator includes a voltage-current converter, $1^{st}$ to $n^{th}$ curve generators for mirroring the current from the voltage-current converter, outputting a current adjusted according to a predetermined ratio, and an output end for outputting the sum of the current from the $1^{st}$ to $n^{th}$ curve generators. The exponential current generator is configured to generate the current exponentially adjusted according to the control voltage.

16 Claims, 11 Drawing Sheets

FOREIGN PATENT DOCUMENTS

| | | |
|---|---|---|
| JP | 2001-036366 A | 2/2001 |
| JP | 2003-218649 A | 7/2003 |
| KR | 2003-48776 | 6/2003 |
| KR | 2004-11741 | 11/2004 |

OTHER PUBLICATIONS

Dutch Industrial Property Office Search Report, mailed Feb. 13, 2007.

Japanese Patent Office, Office Action issued Nov. 18, 2008.

* cited by examiner

EXPONENTIAL FUNCTION GENERATOR AND VARIABLE GAIN AMPLIFIER USING THE SAME

CLAIM OF PRIORITY

This application claims the benefit of Korean Patent Application No.2005-54496 filed on Jun. 23, 2005, in the Korean Intellectual Property Office, the disclosure of which is incorporated herein by reference.

BACKGROUND OF THE INVENTION

1. Field of the Invention

The present invention relates to an exponential function generator which generates an exponential function signal to produce linearly variable gains and a variable gain amplifier using the same.

2. Description of the Related Art

In a Radio Frequency (RF) receiver with its flexible transmission environment, an input signal is variable in a wide range whereas an output signal needs to be in a uniform magnitude as a uniform magnitude of signal is required at the demodulation end. Thus, the RF receiver is used with an automatic gain control system which regulates the magnitude of the signal.

Figure 1:
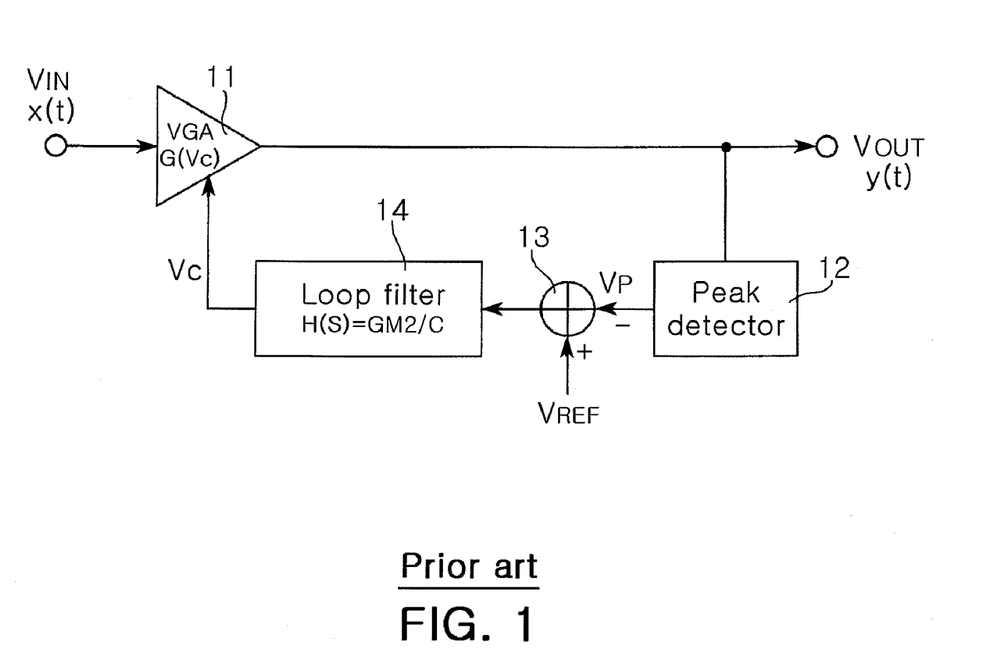
FIG. 1 is a block diagram illustrating a basic structure of a typical automatic gain control loop.

FIG. 1 illustrates a basic concept of an automatic gain control system. The automatic gain control system amplifies an input signal $V_{in}$ by a variable gain amplifier 11 while detecting the magnitude of an output signal $V_{out}$ by a peak detector 12 and then compares the detected magnitude with a reference value $V_{REF}$ to generate a control signal $V_c$ corresponding to the difference to vary the gain of the variable gain amplifier 11, so that the output signal $V_{out}$ maintains a predetermined magnitude.

Such an automatic gain control system is composed of a negative feedback circuit in which a time constant changes in accordance with the gain of the variable gain amplifier 11, and thus is difficult to be maintained stably.

In order to solve such a problem, the gain of the variable gain amplifier 11 needs to be varied in a linear form per decibel (dB) in accordance with the control signal. Accordingly, the variable gain amplifier 11 of the automatic gain control system needs to be configured to provide exponential voltage gains in accordance with the control signal $V_c$ applied. The variable gain amplifier 11 adopts multistage-connected current amplifiers (not shown) in which the gain is varied in proportion to a bias current, configured to exponentially vary the bias current of the current amplifier in accordance with the gain control signal $V_c$. Here, the means for converting the control signal into a current signal of an exponential function is called an exponential function generator.

Figure 2A:
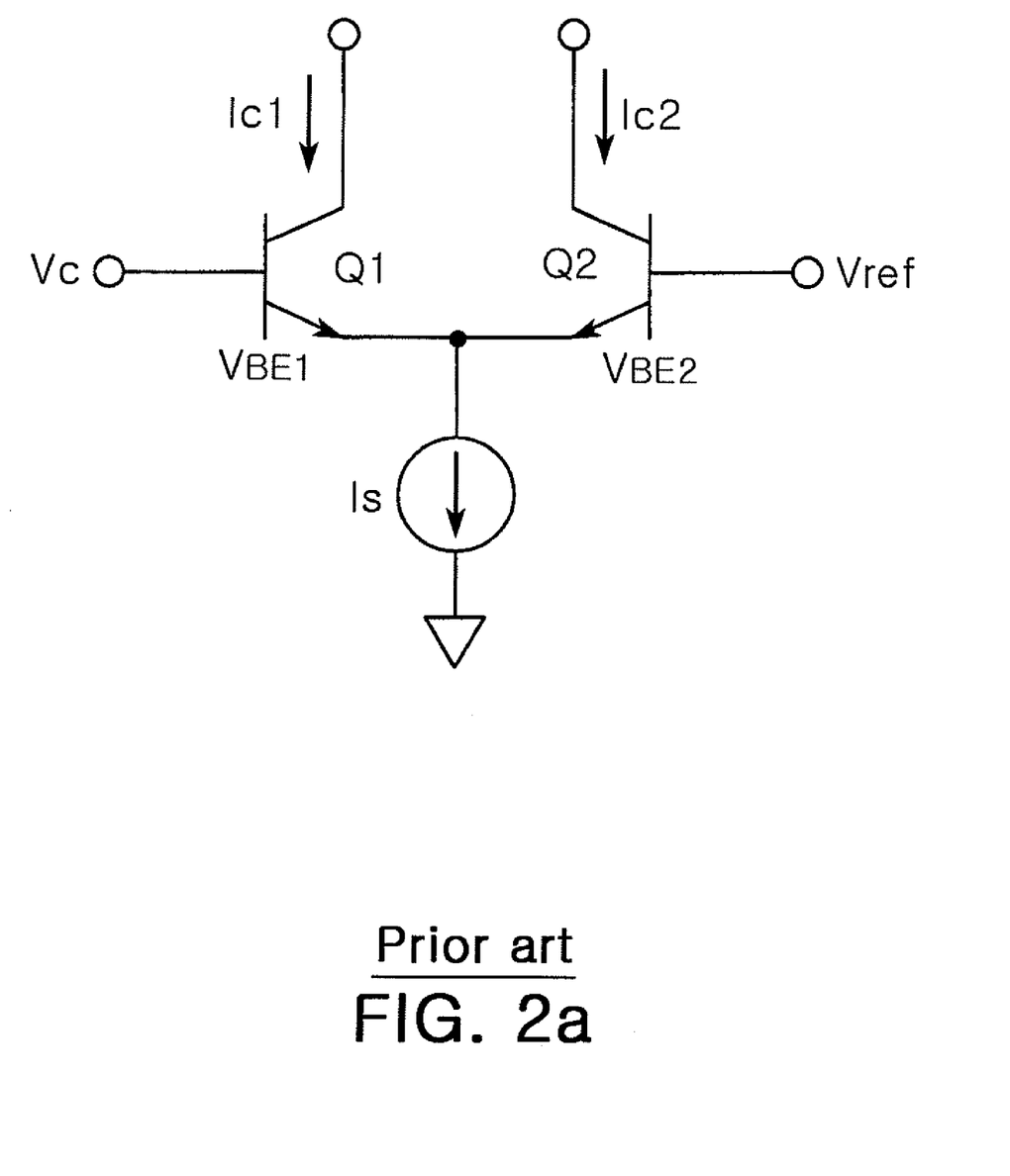
FIGS. 2a to 2c illustrate different types of conventional exponential function generators.

The basic structure of an exponential function generator is illustrated in FIG. 2a. The circuit shown in FIG. 2a adopts the Bipolar Junction Transistor (BJT), utilizing its exponential current characteristics, which can be represented by following Equation 1.

$$I_{C1} = I_S e^{\frac{V_{BE1}}{V_T}}$$

$$I_{C2} = I_S e^{\frac{V_{BE2}}{V_T}}$$

Equation 1

-continued $$V_{BE1} - V_{BE2} = V_C - V_{ref}$$

$$\frac{I_{C1}}{I_{C2}} = e^{\frac{V_{BE1} - V_{BE2}}{V_T}} = e^{\frac{V_C - V_{ref}}{V_T}}$$

As shown in Equation 1, the currents $I_{C1}$ and $I_{C2}$ are generated exponentially according to the control voltage. In this structure, however, the temperature voltage $V_T$ is affected by the temperature, and thus requires an appropriately designed temperature compensation circuit. Also, the usable voltage range in this structure is very low in the tens of mV, with an attendant drawback of requiring an additional circuit for regulating the voltage level. This type of variable gain amplifier is explained in U.S. Pat. No. 6,259,321(entitled "CMOS Variable Gain Amplifier and Control Method therefore").

An alternative form of exponential function generator uses Taylor series expansion as shown in following Equation 2.

$$\exp(ax) \approx 1 + \frac{a}{1!}x + \frac{a^2}{2!}x^2 + \ldots + \frac{a^n}{n!} + \ldots$$

Equation 2

The above Equation 2 can be approximated to $$\exp(ax) \approx 1 + \frac{a}{1!}x + \frac{a^2}{2!}x^2,$$

when $|X|<<1$. The exponential function generator using the Taylor Series expansion takes a form of circuit with the constant term, the proportional term, and the square term in Equation 2.

Figure 2B:
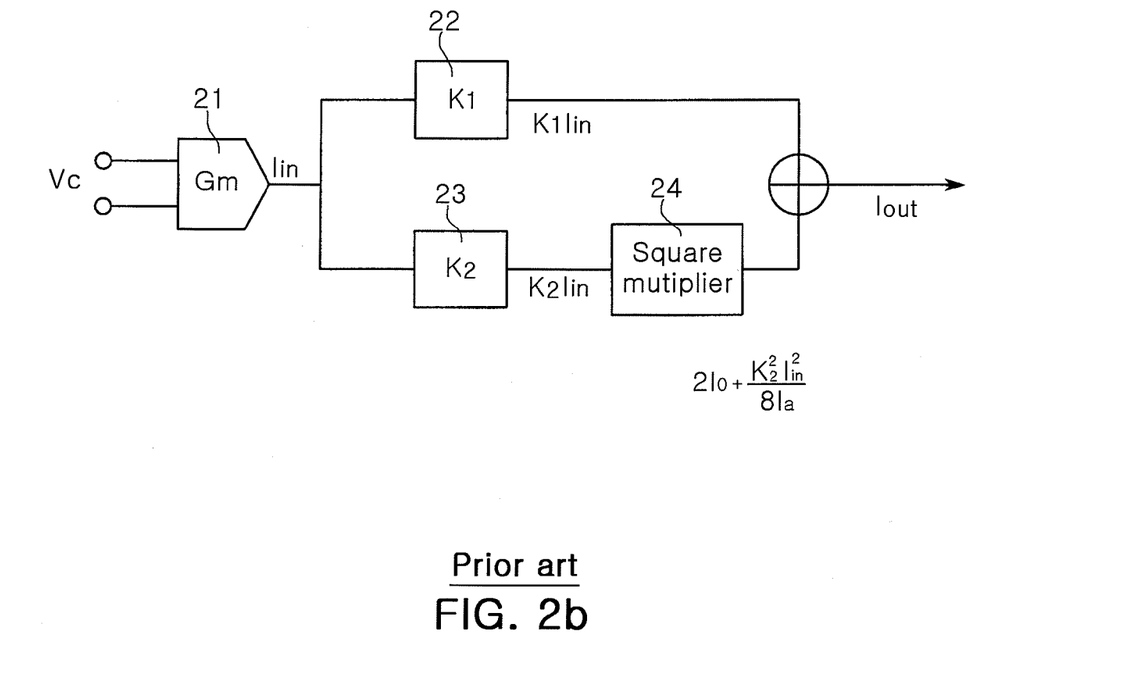

For the exponential function generator shown in FIG. 2b, the output current $I_{out}$ is represented by following Equation 3.

$$I_{out} = 2I_0 + K_1 I_{in} + \frac{K_2^2 I_{in}^2}{8I_0} = 2I_0 \left[ 1 + \frac{K_1}{2}\frac{I_{in}}{I_0} + \frac{K_2^2}{16}\left(\frac{I_{in}}{I_0}\right)^2 \right]$$

Equation 3

In Equation 3, $I_o$ is a bias current, $I_{in}$ is an input current which is a current value converted from the control voltage outputted from a GM cell 21, and K1 is the gain of a transfer function 22.

The exponential function generator using the above Taylor Series expansion requires a square circuit as shown, and also needs to satisfy $I_{in}<<I_o$.

Yet another alternative form of exponential function generator uses a pseudo-exponential function as follows.

$$\exp(2x) \approx \frac{1+x}{1-x},$$

if $$|x| \langle\langle 1$$

Figure 2C:
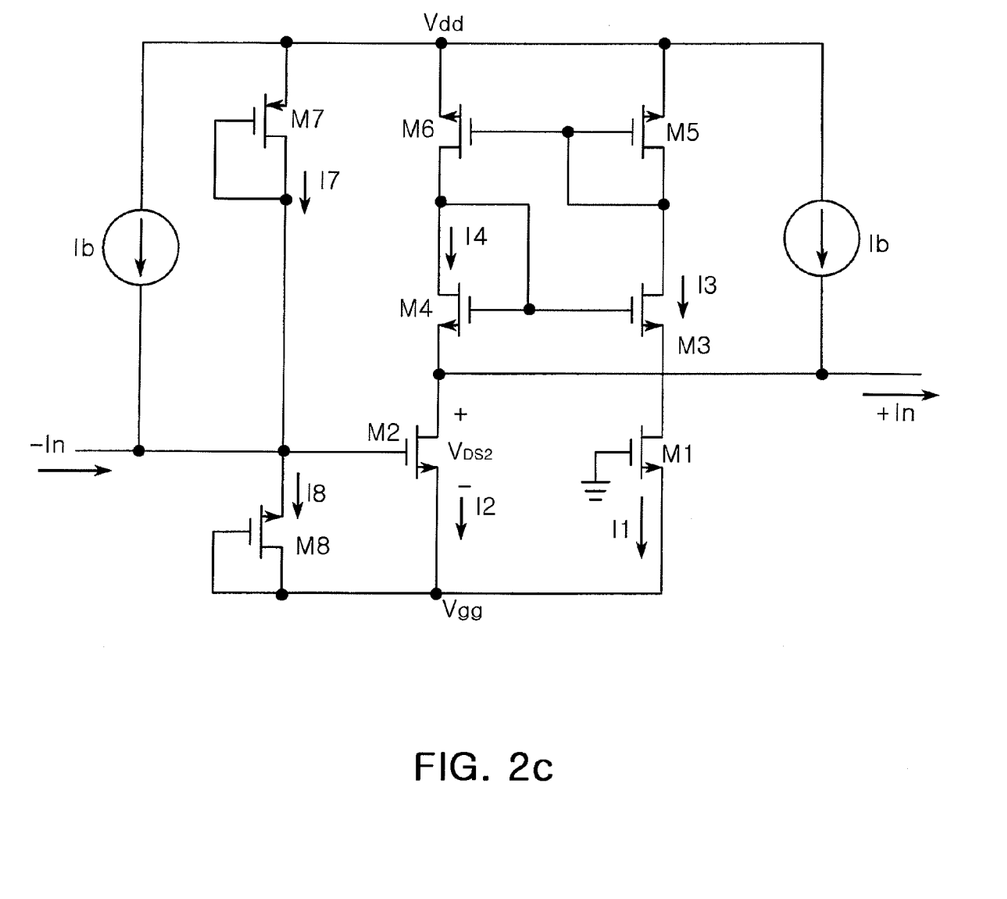

FIG. 2c illustrates an exponential function generator employing the pseudo-exponential function. In the circuit shown in FIG. 2c, the output value $V_{DS2}$ obtained is represented by an exponential function of an input current $I_{in}$ as shown in the following equation.

$$V_{DS2} = \frac{2K_p(V_{DD} - |V_{TP}|)}{K_n} \frac{I_b + I_{in}}{I_b - I_{in}}$$

$$= \frac{2K_p(V_{DD} - |V_{TP}|)}{K_n} \frac{1 + I_{in}/I_b}{1 - I_{in}/I_b}$$

$$= \frac{2K_p(V_{DD} - |V_{TP}|)}{K_n} \exp\left(2\frac{I_{in}}{I_b}\right)$$

However, this type of exponential function generator has to satisfy x<<1, i.e., $I_{in}$<<$I_b$. Also for this type, it is important to establish an appropriate operating point.

Other than the above types, there is an exponential function generator adopting a digital method in which a look-up table with exponential functions corresponding to the output value in proportion to the input value is provided. Then the data of the exponential function produced from the look-up table is converted into analogue signals (current or voltage) simply through a digital-analogue converter. But this type requires both the digital circuit and the analogue circuit, and plus the analogue-digital converter (ADC) and the digital-analogue converter (DAC), resulting in a complicated structure.

As described above, each type of conventional exponential function generator has drawbacks. Therefore, there needs to be researches on an exponential function generator which is not burdened with the use of BJT in the CMOS process, without limitations in the physical properties of the square circuit or the elements, and embodied through only an analogue method so as not to be complicated in its configuration.

SUMMARY OF THE INVENTION

The present invention has been made to solve the foregoing problems of the prior art and it is therefore an object of the present invention to provide an exponential function generator which is realizable with CMOS element only, without BJT element, having no limitations in the physical properties of a square circuit or elements, and realized only through an analogue circuit without having a complicated configuration and a variable gain amplifier using the same.

According to an aspect of the invention for realizing the object, there is provided an exponential function generator for generating a current that is changed exponentially according to a control voltage, including: a voltage-current converter for converting the control voltage into a current; $1^{st}$ to $n^{th}$ curve generators each for mirroring the current outputted from the voltage-current converter to output a current corresponding to a predetermined ratio to the current outputted from the voltage-current converter, where n is a natural number greater or equal to 2; and an output end for summing up the current outputted from each of the $1^{st}$ to $n^{th}$ curve generators to output a resultant current.

In addition, in the exponential function generator according to the present invention, the ratios of the input current to the output current of the $1^{st}$ to $n^{th}$ curve generators are different from each other. More preferably, each of the ratios of the input current to output current of the $1^{st}$ to $n^{th}$ curve generators is determined by each of the slopes of n number of divided sections of a desired exponential output curve.

In addition, in the exponential function generator according to the present invention, each of the $1^{st}$ to $n^{th}$ curve generators includes: a first current mirror for receiving the current outputted from the voltage-current converter to output a current corresponding to a predetermined ratio to the current received from the voltage-current converter; a second current mirror for receiving the current outputted from the first current mirror to output a current corresponding to a predetermined ratio to the current received from the first current mirror; and a third current mirror for receiving the current outputted from the second current mirror to output a current corresponding to a predetermined ratio to the current received from the second current mirror.

In addition, in the exponential function generator according to the present invention, each of the $2^{nd}$ to $n^{th}$ curve generators further comprises a fourth current mirror for receiving a predetermined level of reference current, and if the current applied to the second current mirror is less than or equal to the received reference current, bypassing the current outputted from the first current mirror to a ground to block input into the second current mirror.

In addition, in the exponential function generator according to the present invention, the reference current applied to the fourth current mirror is determined by the value of the current of the first current mirror, corresponding to the current of the starting point of the divided section of a particular curve generator.

According to another aspect for realizing the object, the present invention provides a variable gain amplifier comprising at least one variable gain amplifying circuit varying a gain in response to the current outputted from the exponential function generator.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following description will present an exponential function generator and a variable gain amplifier using the same with reference to the accompanying drawings.

In the present invention, the exponential function graph required in the variable gain amplifier is divided into a plurality of sections, and the curve of each section is represented by the most approximate linear graph, thereby forming the most approximate exponential graph. As the sections are made narrower, the exponential function graph becomes a closer approximation to the ideal exponential graph.

Figure 3:
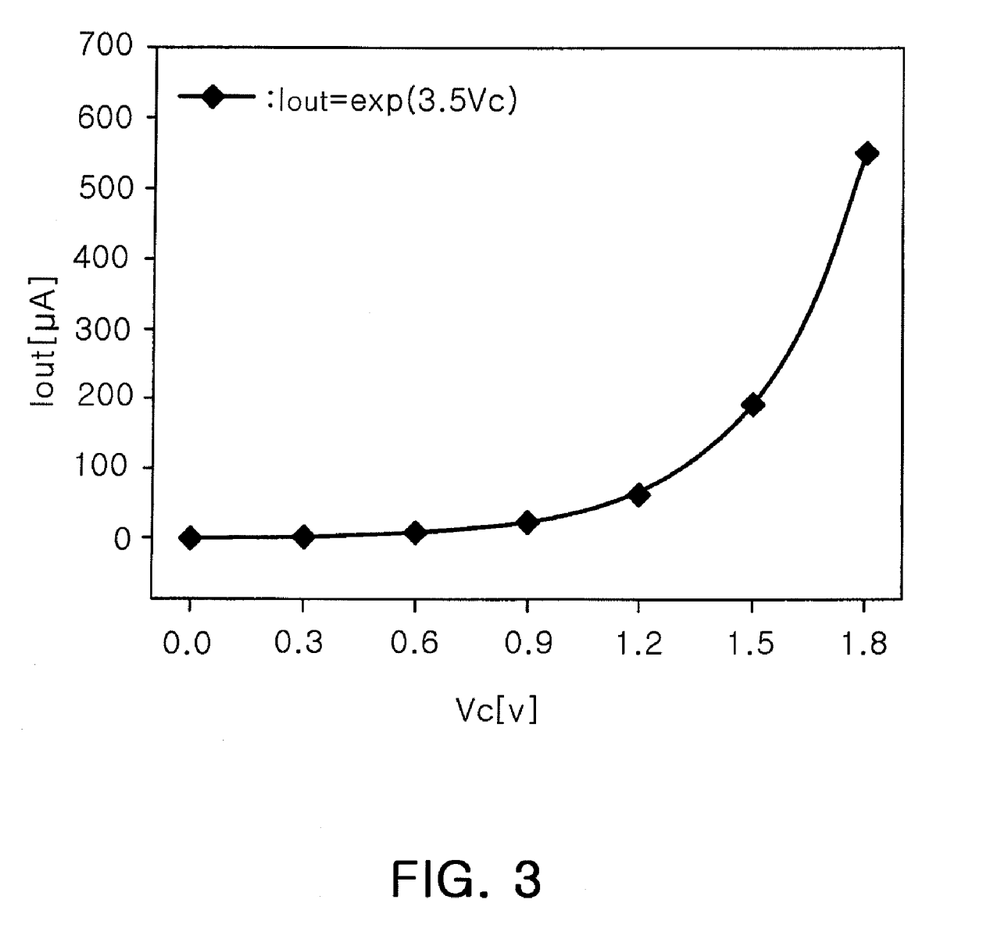
FIG. 3 is a graph illustrating ideal output current in proportion to control voltage in an exponential function generator.

For example, the ideal exponential curve required in the variable gain amplifier (VGA) of the automatic gain control system, shown in FIG. 3, is divided into 6 sections. The input value $V_c$ and the output value $I_{out}$ corresponding respectively to the starting point and the ending point of each section are presented in following Table 1.

TABLE 1

| $V_c[V]$ | $I_{out}[\mu A]$ | $I_{out}\hat{}[\mu A]$ |
|---|---|---|
| 0 | 1 | 0 |
| 0.3 | 2.8577 | 3 |
| 0.6 | 8.1662 | 8 |
| 0.9 | 23.3361 | 23 |
| 1.2 | 66.6863 | 60 |
| 1.5 | 190.5663 | 190 |
| 1.8 | 544.5719 | 600 |

$V_c$ and $I_{out}$ in the above Table 1 are actual values of the ideal exponential graph in FIG. 3, and $I_{out}\hat{}$ is the approximate value set for designing the circuit according to the present invention.

Figure 4:
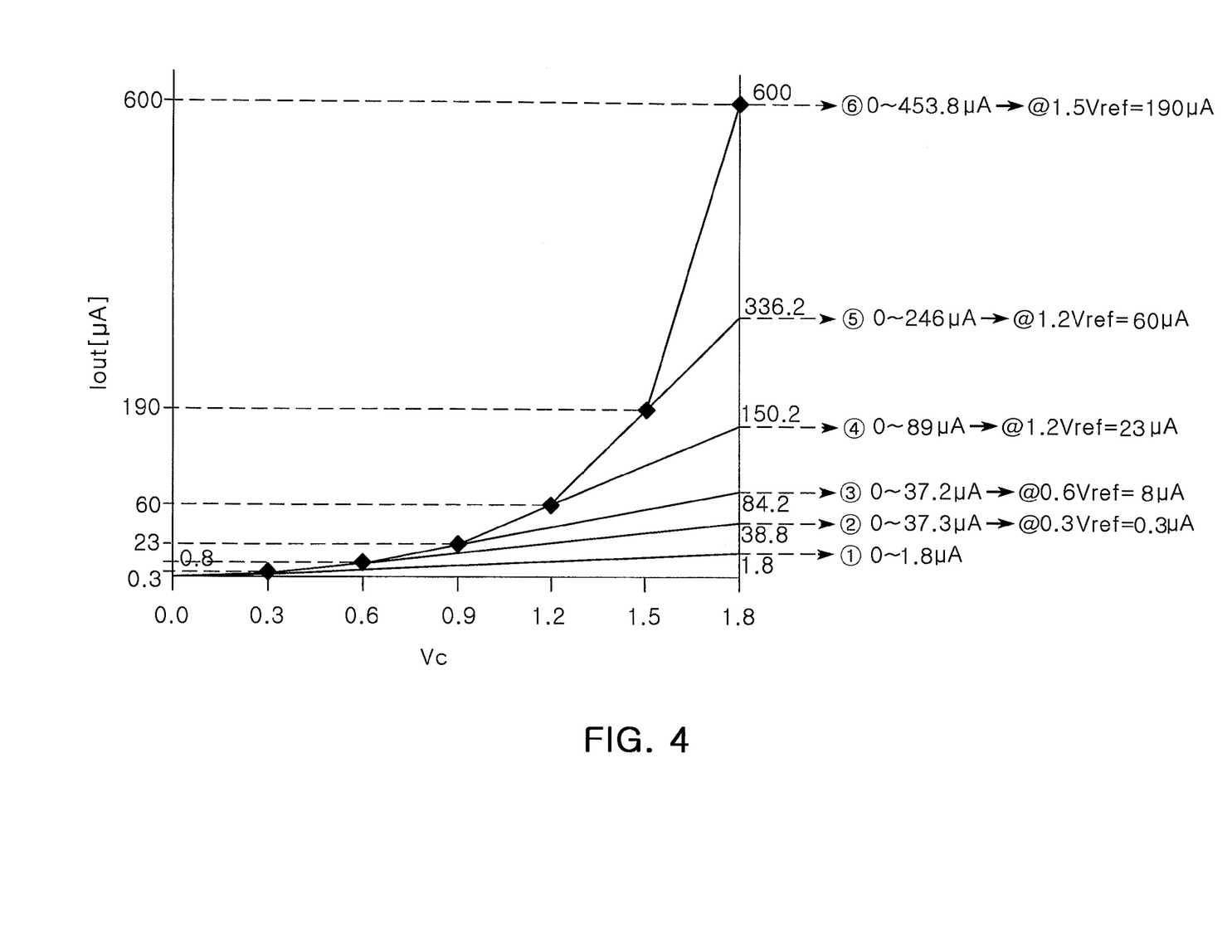
FIG. 4 is a graph illustrating the fundamentals of an exponential function generator according to the present invention.

The starting point and the ending point of each divided section as displayed in the Table 1 can be connected in a line to obtain an exponential function curve approximation as shown in FIG. 4.

According to the present invention, the exponential function generator divides the desired exponential function graph into a plurality of sections, and then a linear graph is formed by connecting the starting points and the ending points of the sections. Then the graphs for all sections are summed up to obtain the exponential curve approximation as shown in FIG. 4.

Figure 5:
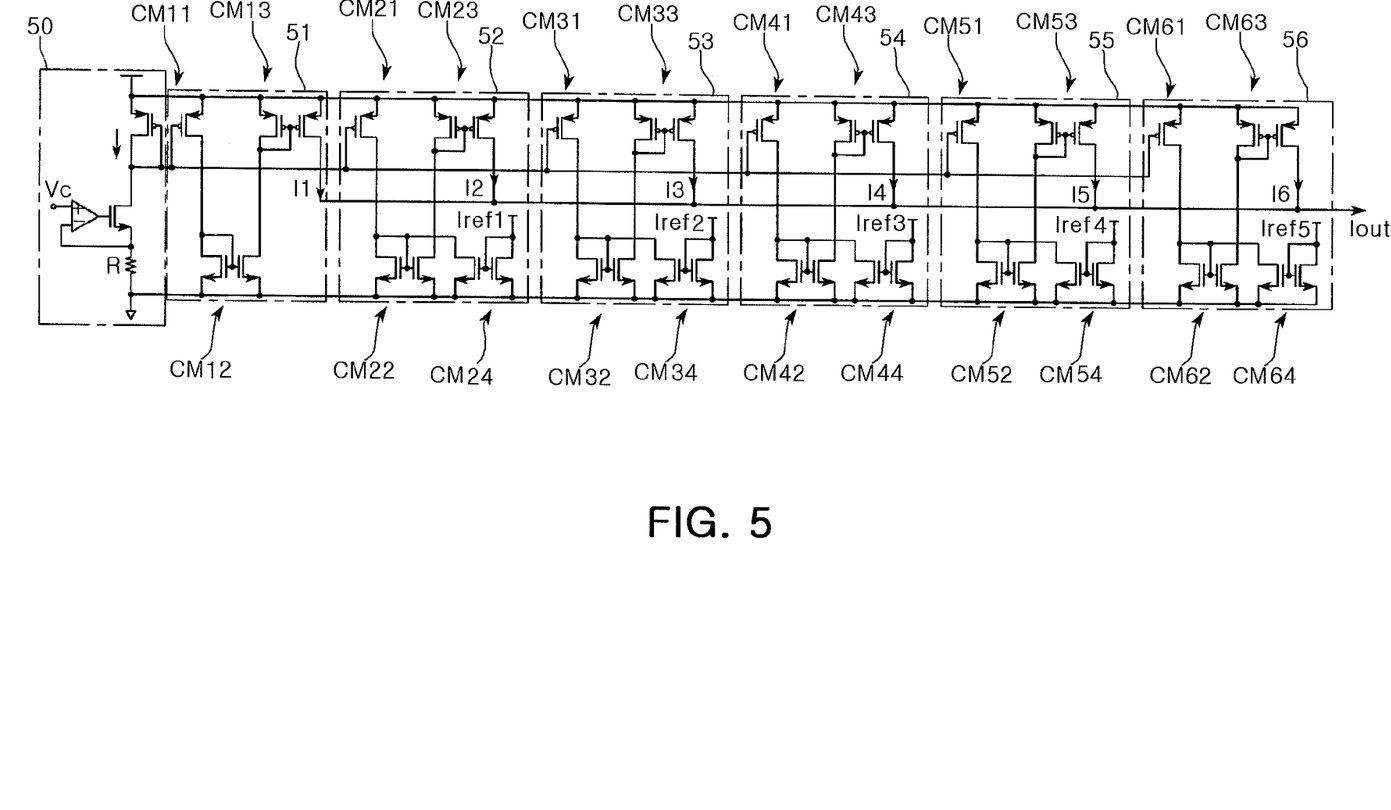
FIG. 5 is a block diagram illustrating an example of exponential function generator according to the present invention.

FIG. 5 is a circuit diagram illustrating a preferred embodiment of an exponential function generator which realizes the exponential curve approximation of FIG. 4, according to the present invention.

With reference to FIG. 5, the exponential function generator according to the present invention includes a voltage-current converter 50, $1^{st}$ to $6^{th}$ curve generators 51 to 56 for mirroring the current outputted from the voltage-current converter 50 to output a current corresponding to a predetermined ratio from among the output current of the voltage-current converter 50, and an output end $I_{out}$ for summing up the current outputted from each of the $1^{st}$ to $6^{th}$ curve generators 51 to 56 to output a resultant current.

In the preferred embodiment, the exponential curve is divided into six sections, thus having $1^{st}$ to $6^{th}$ curve generators 51 to 56. However, the number of divisions in an exponential curve can be changed to n (natural number greater than or equal to 2), in which case the exponential function generator is provided with n number of the curve generators. "n" can be set arbitrarily as the exponential function generator is designed. With a larger number of n, the current outputted from the exponential function generator becomes closer to the ideal exponential curve.

With references to FIGS. 4 and 5, the $1^{st}$ to $6^{th}$ curve generators 51 to 56 are provided to form the graphs □ to □, respectively. The outputs of the $1^{st}$ to $6^{th}$ curve generators 51 to 56 are summed up to obtain a result similar to the ideal exponential curve.

More specifically, the $1^{st}$ to $6^{th}$ curve generators 51 to 56 include first current mirrors CM11, CM21, CM31, CM41, CM51, CM61 for receiving the output current $I_c$ from the voltage-current converter 50 to output a current corresponding to a predetermined ratio from among the output current $I_c$; second current mirrors CM12, CM22, CM32, CM42, CM52 and CM62 for receiving the output current from the first current mirrors CM11, CM21, CM31, CM41, CM51 and CM61 to output a current corresponding to a predetermined ratio from among the received current; and third current mirrors CM13, CM23, CM33, CM43, CM53 and CM63 for receiving the current from the second current mirrors CM12, CM22, CM32, CM42, CM52 and CM62 to output a current corresponding to a predetermined ratio from among the output current from the second current mirrors CM12, CM22, CM32, CM42, CM52 and CM62, to the output end $I_{out}$.

The mirroring ratio of each current mirror is set such that the sum of the ratios of the input to the output of the first to third current mirrors are the same as the slopes of the input to the output set for the $1^{st}$ to $6^{th}$ curve generators 51 to 56.

In addition, the $2^{nd}$ to $6^{th}$ curve generators 52 to 56 further include fourth current mirrors CM24, CM34, CM44, CM54, CM64 which receive predetermined reference currents $I_{ref1}$ to $I_{ref5}$, respectively. Here, if the current applied from the first current mirror CM11, CM21, CM31, CM41, CM51, CM61 to the second current mirror CM12, CM22, CM32, CM42, CM52, CM62 is less than or equal to the reference current, the fourth current mirror CM24, CM34, CM44, CM54, CM64 bypasses the output current from the first current mirror CM11, CM21, CM31, CM41, CM51, CM61 to a ground to block entry into the second current mirror CM12, CM22, CM32, CM42, CM52, CM62.

The $1^{st}$ curve generator 51 produces a graph starting with the starting value (e.g. 0V) of the variable range (e.g. 0-1.8V) of the control voltage $V_c$. However, the $2^{nd}$ to $6^{th}$ curve generators 52 to 56 do not operate in the variable range where the control voltage is less than each of the reference voltages. For these reasons, the $2^{nd}$ to $6^{th}$ curve generators 52 to 56 further include the fourth current mirrors CM24, CM34, CM44, CM54 and CM64.

Figure 6A:
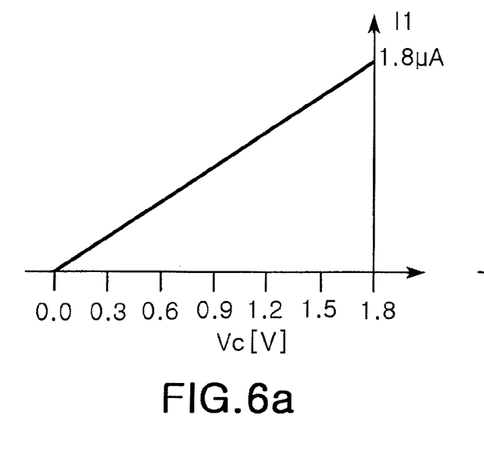
FIGS. 6a to f are graphs illustrating output currents of each curve generator of the exponential function generator shown in FIG. 5.
Figure 6B:
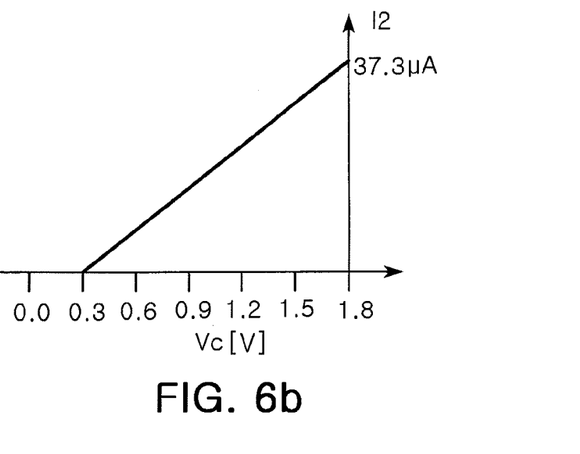
Figure 6C:
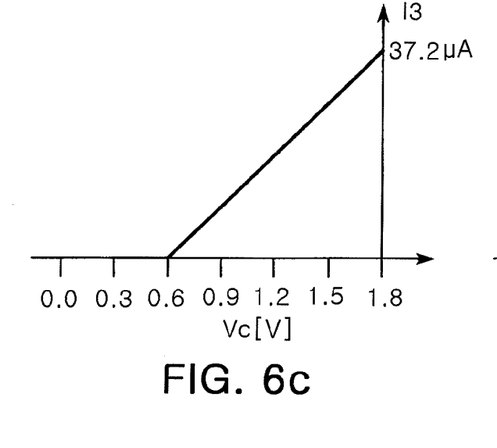
Figure 6D:
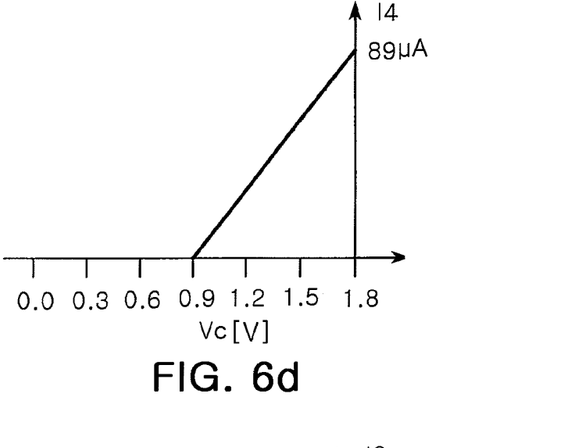
Figure 6E:
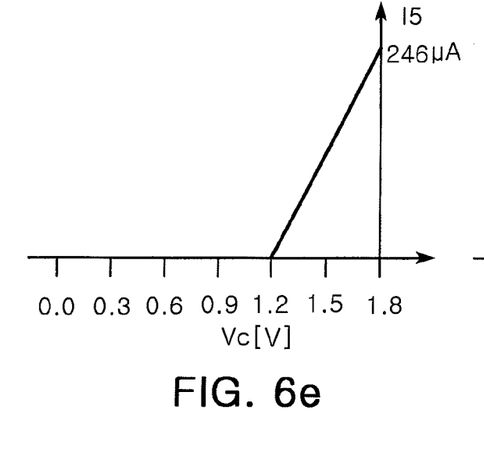
Figure 6F:
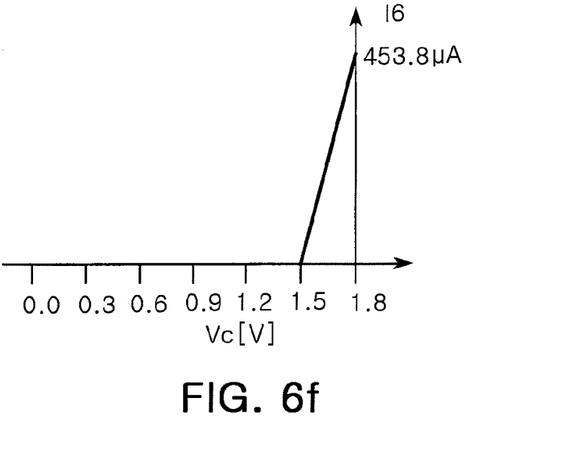
Figure 7:
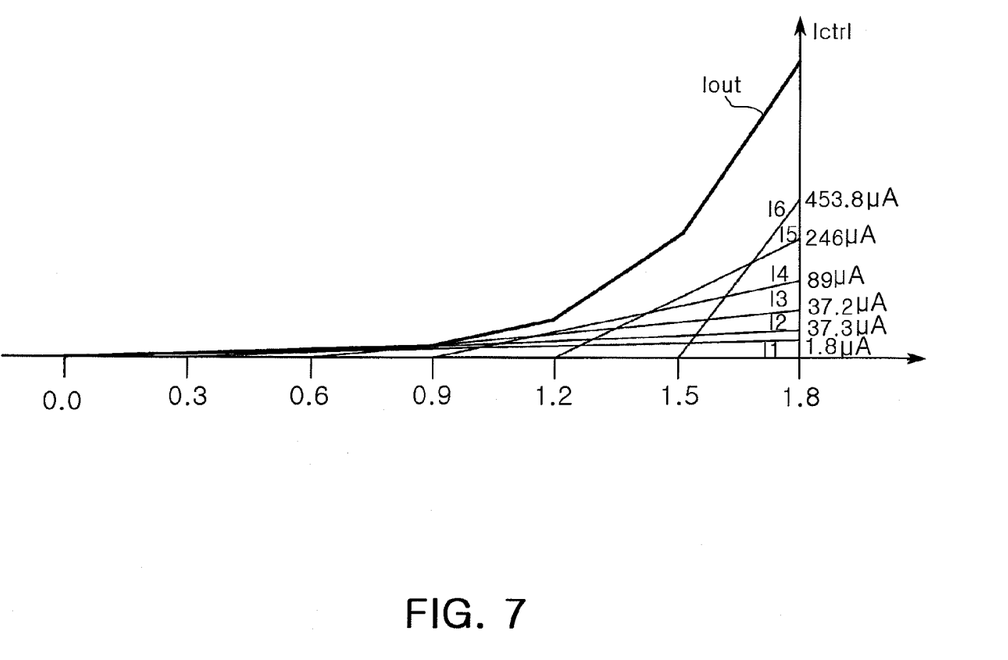
FIG. 7 is a graph illustrating the output current of the exponential function generator shown in FIG. 5.

FIGS. 6a to 6d are graphs illustrating the output current $I_1$ to $I_6$ of the $1^{st}$ to $6^{th}$ curve generators 51 to 56, and FIG. 7 is a graph showing the result at the output end $I_{out}$ of the exponential function generator according to the present invention.

In the exponential function shown in FIG. 4, the output voltage $I_{out}$ of the exponential function generator shown in FIG. 5 is as follows. $I_{out}=I_1$ for the section where the control voltage $V_c$ is greater than or equal to 0V and less than 0.3 V; $I_{out}=I_1+I_2$ for the section where $V_c$ is greater or equal to 0.3V and less than 0.6V; $I_{out}=I_1+I_2+I_3$ for the section where $V_c$ is greater than or equal to 0.6V and less than 0.9V; $I_{out}=I_1+I_2+I_3+I_4$ for the section where $V_c$ is greater than or equal to 0.9V and less than 1.2V; $I_{out}=I_1+I_2+I_3+I_4+I_5$ for the section where $V_c$ is greater than or equal to 1.2V and less than 1.5V; and $I_{out}=I_1+I_2+I_3+I_4+I_5+I_6$ for the section where $V_c$ is greater than or equal to 1.5V and less than 1.8V.

The starting voltages of the $2^{nd}$ to $6^{th}$ curve generators 52 are 0.3V, 0.6V, 0.9V, 1.2V and 1.5V, respectively. Thus, the reference currents $I_{ref1}$-$I_{ref5}$ applied to the fourth current mirrors CM24-CM64 of the $2^{nd}$ to $6^{th}$ curve generators 52 are set in the amounts equal to those of the currents outputted from the first current mirrors CM21, CM31, CM41, CM51 and CM61 when each of the above starting voltage is applied.

As described above, the $2^{nd}$ to $6^{th}$ curve generators 52 to 56 have the same constitutions and operations except for the ratios of the input to the output of the first to third current mirrors and the reference currents $I_{ref1}$-$I_{ref5}$ of the fourth current mirrors. Therefore, for the $1^{st}$ to $6^{th}$ curve generators 51 to 56, hereinafter, only the explanation on the $1^{st}$ and $2^{nd}$ curve generators 51 and 52 will be provided. The detailed constitutions and the operations of the rest 3$^{rd}$ to 6$^{th}$ curve generators 53 to 56 can be understood with reference to the explanation on the 2$^{nd}$ curve generator.

Figure 8:
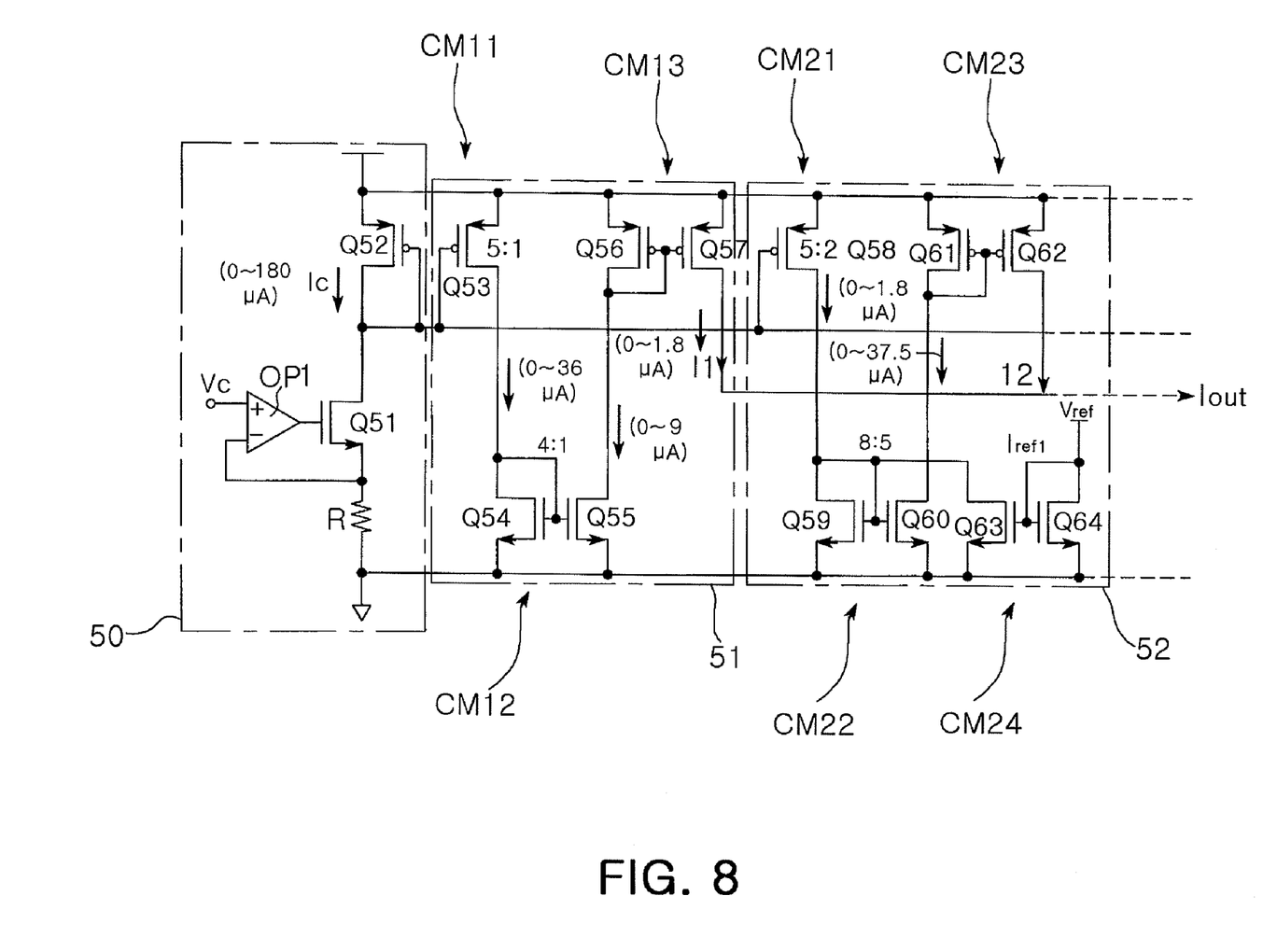
FIG. 8 is a detailed circuit diagram of a part of the exponential function generator according to the present invention.

Referring to the partially magnified view in FIG. 8, in the exponential function generator according to the present invention, the voltage-current converter 50 includes an operation amplifier OP1 having an inversion terminal applied with the control voltage V$_c$ and a non-inversion terminal grounded through a resistor R, a first transistor Q51 having a gate receiving the output from the operation amplifier OP1 and a source grounded through the resistor, and a second transistor Q52 having a drain and a gate connected to a drain of the first transistor Q51 and a source connected to a power source end V$_{DD}$.

Moreover, the first current mirrors CM11 and CM21 include a second transistor Q52 of the voltage-current converter 50, and third transistors Q53 and Q58 having a source connected to the power source end V$_{DD}$ and a gate connected to a gate of the second transistor Q52 to output a current corresponding to a predetermined ratio of the current applied to a drain of the second transistor Q52. The second current mirrors CM12 and CM22 include fourth transistors Q54 and Q59 having a drain and a gate connected to a drain of the third transistors Q53 and Q58 and a source grounded, and fifth transistors Q55 and Q60 having a gate connected to a gate of the fourth transistors Q54 and Q59 and a source grounded. The third current mirrors CM13 and CM23 include sixth transistors Q56 and Q61 having a drain and a gate connected to a drain of the fifth transistors Q55 and Q60 and a source connected to the power source end V$_{DD}$; and seventh transistors Q57 and Q62 having a gate connected to a gate of the sixth transistors Q56 and Q61 and a source connected to the power source end V$_{DD}$. Lastly, the fourth current mirrors CM24 include an eighth transistor Q63 disposed between a drain of the third transistor Q58 and a ground; and a ninth transistor Q64 having a gate and a drain connected to a gate of the eighth transistor Q63, a source grounded, and a drain applied with the reference current I$_{ref1}$-I$_{ref5}$.

In the exponential function generator with the above described constitution, the control voltage V$_c$ is applied to the gate of the first transistor Q51 through the operation amplifier OP1 and converted into the current signal I$_c$ via the operation of the first transistor Q51 and the resistor R. At this time, the relationship between the current I$_c$, the output signal of the voltage-current converter 50 and the voltage control V$_c$ can be represented by following Equation 4.

$$I_C = \frac{V_C}{R} \qquad \text{Equation 4}$$

Therefore, the current I$_c$ can be adjusted in its variable range by changing the value of the resistor R. With a typical variable range of 0 to 1.8V of the control voltage V$_c$, and the resistor being set 10 kΩ, the current I$_c$ has a range of 0 to 180 μA, linearly in proportion to the control voltage.

The 1$^{st}$ to 6$^{th}$ curve generators 51 to 56 provided at the back end exponentially change the current I$_c$.

To be more specific, the current Ic is mirrored to the drain of the third transistor Q53 which forms a current mirror circuit in combination with the second transistor Q52. At this time, the current 0-36 μA corresponding to a predetermined ratio (e.g. 5:1) runs on the drain of the third transistor Q53. The current outputted through the drain of the third transistor Q53 is applied to the drain of the fourth transistor Q54 and mirrored to the drain of the fifth transistor Q55. At this time, the current present on the drain of the fifth transistor Q55 is about 0 to 9 μA, corresponding to the ratio of 4:1 to the current applied to the fourth transistor Q54. The current outputted through the fifth transistor Q55 is inputted to the sixth transistor Q56 and then mirrored to the drain of the seventh transistor Q57. At this time, the ratio of the drain current of the sixth transistor Q56 to the drain current of the seventh transistor Q57 is 5:1. Therefore, about 0 to 1.8 μA of current is outputted from the seventh transistor Q57. As a result, with the input of 0 to 1.8V of control voltage V$_c$, about 0 to 1.8 μA of current I$_1$ is generated. The relationship of the control voltage V$_c$ and the output current I$_1$ of the 1$^{st}$ curve generator is as shown in the graph in FIG. 6a, and the current I$_c$ and the relationship between the output current I$_1$ of the 1$^{st}$ curve generator can be defined by following Equation 5.

$$I_1 = I_C \times \frac{1}{100} \qquad \text{Equation 5}$$

Next, the operations of the 2$^{nd}$ curve generator are explained.

As described hereinabove, the current I$_c$ outputted from the voltage-current converter 50 is mirrored to the drain of the third transistor Q58 of the 2$^{nd}$ curve generator 52. At this time, the current I$_c$ and the drain current of the third transistor Q58 has the ratio of, for example, 5:2. Therefore, for example, 0 to 72 μA of current is present on the drain of the third transistor Q58. The current outputted through the drain of the third transistor Q58 is applied to the drain of the fourth transistor Q59 and then mirrored to the drain of the fifth transistor Q60. At this time, the ratio of the drain current of the fourth transistor Q59 to the drain current of the fifth transistor Q60 is 8:5, with about 0 to 37.5 μA of current present on the drain of the fifth transistor Q60. The drain of the third transistor Q58 is connected to the drain of the fourth transistor Q58 and to the drain of the eighth transistor Q63 at the same time. The eighth transistor Q63 forms a current mirror in combination with the ninth transistor Q64 which has a predetermined reference current I$_{ref1}$ running thereon. Thus, the same amount of current as the reference current I$_{ref1}$ should be running on the eighth transistor Q63 (e.g. 12 μA). Therefore, among from the drain current of the third transistor Q58, the current equal to or less than the reference current runs to the eighth transistor Q63 to be bypassed at the ground and the rest is inputted into the fourth transistor Q59 to be mirrored to the fifth transistor Q60. The current outputted from the fifth transistor Q60 is inputted to the sixth transistor Q61 to be mirrored to the drain of the seventh transistor Q62. At this time, the ratio of the drain current of the sixth transistor Q61 to the drain current of the seventh transistor Q62 is 1:1. Thus, when the current I$_c$ is generated from the voltage-current converter 50, the current outputted from the 2$^{nd}$ curve generator 52 can be defined by following Equation 6 and is as shown in the graph in FIG. 6b.

$$I_2 = (I_c \times 2/5 - I_{ref1}) \times 5/8 \qquad \text{Equation 6}$$

In the same manner as the 2$^{nd}$ curve generator 52, the 3$^{rd}$ to 6$^{th}$ curve generators 53 to 56 each mirrors each current Ic to output a predetermined current I$_3$-I$_6$. At this time, the current mirroring ratios and the reference currents are set differently for the 2$^{nd}$ to 6$^{th}$ curve generators 52 to 56, and thus each output current I$_3$ to I$_6$ is different from another. The currents I$_3$-I$_6$ according to the preferred embodiment are as shown in FIGS. 6c to f.

The currents outputted from the $1^{st}$ to $6^{th}$ curve generators 51 to 56 are outputted through the output end $I_{out}$. Therefore, the total amount of all the currents from the $1^{st}$ to $6^{th}$ curve generators 51 to 56 is present at the output end $I_{out}$, which is the result of summing up the graphs (a) to (f) to ultimately form the graph in FIG. 7. The output result is similar to the ideal exponential function graph shown in FIG. 4.

Figure 9:
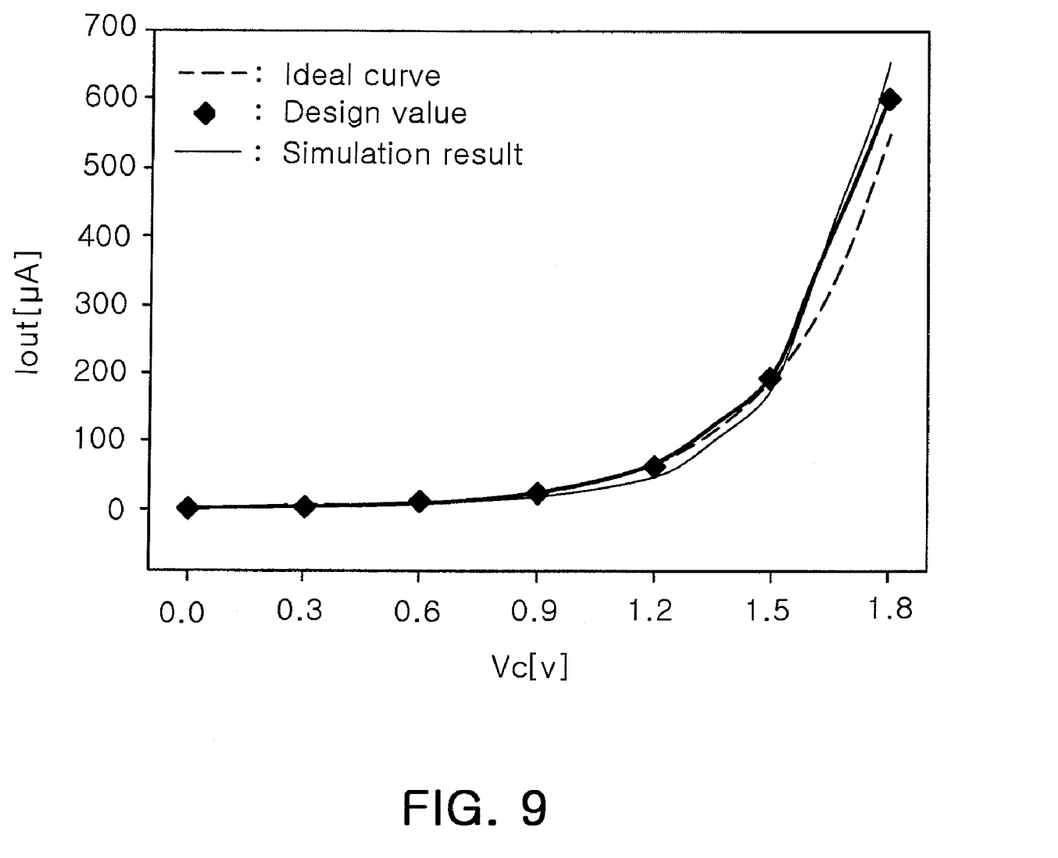
FIG. 9 is a graph illustrating the simulation result of the exponential function generator according to the present invention.

FIG. 9 is a comparison of the simulation result of the exponential function generator according to the present invention with the ideal curve, showing they are almost identical.

The exponential function generator as set forth above is used in a variable gain amplifier to linearly change the current of the variable gain amplifying circuit, in proportion to the gain control voltage.

The variable gain amplifier is typically composed of more than one variable gain amplifying circuits that are multistage-connected. In each variable gain amplifying circuit, the gain is varied in response to the current outputted from the above described exponential function generator. In such a variable gain amplifier, the rest of the configuration except for the above exponential function generator is identical to that of a conventional one and thus the drawings and explanation thereof are omitted.

In the present invention as set forth above, linear graphs of a plurality of slopes are combined to generate an output of an exponential curve. The present invention is realizable with the CMOS element only, without the BJT element, not limited by the physical property of the square circuit and the element, and can be simply configured through an analogue method.

While the present invention has been shown and described in connection with the preferred embodiments, it will be apparent to those skilled in the art that modifications and variations can be made without departing from the spirit and scope of the invention as defined by the appended claims.

What is claimed is:

1. An exponential function generator for generating a current that is changed exponentially according to a control voltage, comprising:
    a voltage-current converter for converting the control voltage into a current;
    $1^{st}$ to $n^{th}$ curve generators, each for mirroring the current outputted from the voltage-current converter and to output a current corresponding to a predetermined ratio of an input current of the voltage-current converter to the current outputted from the voltage-current converter, where n is a natural number greater or equal to 2; and
    an output end for summing up the current outputted from each of the $1^{st}$ to $n^{th}$ curve generators to output a resultant current;
    wherein the ratios of the input current to the output current of the $1^{st}$ to $n^{th}$ curve generators are different from each other; and
    wherein each of the $1^{st}$ to $n^{th}$ curve generators comprises:
        a first current mirror for receiving the current outputted from the voltage-current converter to output a current corresponding to a predetermined ratio to the current received from the voltage-current converter;
        a second current mirror for receiving the current outputted from the first current mirror to output a current corresponding to a predetermined ratio to the current received from the first current mirror; and
        a third current mirror for receiving the current outputted from the second current mirror to output a current corresponding to a predetermined ratio to the current received from the second current mirror.

2. The exponential function generator according to claim 1, wherein each of the $2^{nd}$ to $n^{th}$ curve generators further comprises a fourth current mirror for receiving a predetermined level of reference current, and if the current applied to the second current mirror is less than or equal to the received reference current, bypassing the current outputted from the first current mirror to a ground to block input into the second current mirror.

3. The exponential function generator according to claim 2, wherein the reference current applied to the fourth current mirror is determined by the value of the current of the first current mirror, corresponding to the current of the starting point of the divided section of a particular curve generator.

4. A variable gain amplifier comprising:
    the exponential function generator described in claim 3; and
    at least one variable gain amplifying circuit varying a gain in response to the current outputted from the exponential function generator.

5. The exponential function generator according to claim 2, wherein the voltage-current converter comprises:
    an operation amplifier with an inversion terminal applied with a control voltage and a non-inversion terminal grounded through a resistor;
    a first transistor having a gate receiving the input from the operation amplifier and a source grounded through the resistor; and
    a second transistor having a drain and a gate connected to a drain of the first transistor and a source connected to a power source end.

6. A variable gain amplifier comprising:
    the exponential function generator described in claim 5; and
    at least one variable gain amplifying circuit varying a gain in response to the current outputted from the exponential function generator.

7. The exponential function generator according to claim 5, wherein the first current mirror comprises:
    a second transistor of the voltage-current converter; and
    a third transistor having a source connected to the power source end and a gate connected to a gate of the second transistor, the third transistor outputting a current corresponding to a predetermined ratio to the current applied to a drain of the second transistor.

8. A variable gain amplifier comprising:
    the exponential function generator described in claim 7; and
    at least one variable gain amplifying circuit varying a gain in response to the current outputted from the exponential function generator.

9. The exponential function generator according to claim 7, wherein the second current mirror comprises:
    a fourth transistor having a drain and a gate connected to a drain of the third transistor and a source grounded; and
    a fifth transistor having a gate connected to a gate of the fourth transistor and a source grounded.

10. A variable gain amplifier comprising:
    the exponential function generator described in claim 9; and
    at least one variable gain amplifying circuit varying a gain in response to the current outputted from the exponential function generator.

11. The exponential function generator according to claim 9, wherein the third current mirror comprises:
    a sixth transistor having a drain and a gate connected to a gate of the fifth transistor and a source connected to a power source end; and a seventh transistor with a gate connected to a gate of the sixth transistor and a source connected to the power source end.

12. A variable gain amplifier comprising:

the exponential function generator described in claim 11; and at least one variable gain amplifying circuit varying a gain in response to the current outputted from the exponential function generator.

13. The exponential function generator according to claim 7, wherein the fourth current mirror comprises:

an eighth transistor disposed between a drain of the third transistor and a ground; and a ninth transistor having a gate and a drain connected to a gate of the eighth transistor, a source grounded, and a drain applied with a reference current.

14. A variable gain amplifier comprising:

the exponential function generator described in claim 13; and at least one variable gain amplifying circuit varying a gain in response to the current outputted from the exponential function generator.

15. A variable gain amplifier comprising:

the exponential function generator described in claim 2; and at least one variable gain amplifying circuit varying a gain in response to the current outputted from the exponential function generator.

16. A variable gain amplifier comprising:

the exponential function generator described in claim 1; and at least one variable gain amplifying circuit varying a gain in response to the current outputted from the exponential function generator.

* * * * *